United States Patent [19]

Nakamura et al.

[11] Patent Number: 4,697,116
[45] Date of Patent: Sep. 29, 1987

[54] PIEZOELECTRIC VIBRATOR

[75] Inventors: Takeshi Nakamura, Uji; Hiroshi Nishiyama, Muko; Ikuo Matsumoto, Takatsuki, all of Japan

[73] Assignee: Murata Manufacturing Co., Ltd., Japan

[21] Appl. No.: 456,307

[22] Filed: Jan. 6, 1983

[30] Foreign Application Priority Data

Jan. 7, 1982 [JP] Japan .................................. 57-1512

[51] Int. Cl.⁴ ........................................... H01L 41/08
[52] U.S. Cl. ..................................... 310/322; 310/321; 310/363; 310/357
[58] Field of Search ............... 310/321, 322, 364, 363, 310/311, 357, 324

[56] References Cited

U.S. PATENT DOCUMENTS

| | | | |
|---|---|---|---|
| 2,345,491 | 3/1944 | Mason | 310/321 X |
| 2,497,666 | 2/1950 | Gravley | 310/364 |
| 3,209,176 | 9/1965 | Paley | 310/321 X |
| 3,311,760 | 3/1967 | Durgin et al. | 310/321 |
| 3,486,046 | 12/1969 | Zalar | 310/324 |
| 3,509,387 | 4/1970 | Thorn et al. | 310/324 |
| 3,513,356 | 5/1970 | Newell | 310/321 X |
| 3,721,841 | 6/1971 | Wilson | 310/364 |
| 3,732,466 | 5/1973 | Bryant | 310/324 |
| 3,815,129 | 6/1974 | Sweany | 310/324 X |
| 3,912,952 | 10/1975 | Kumon et al. | 310/324 X |
| 3,943,388 | 3/1976 | Massa | 310/324 X |
| 3,970,879 | 7/1976 | Kumon | 310/324 |
| 4,004,409 | 1/1977 | Ganter et al. | 310/322 |
| 4,130,771 | 12/1978 | Bottom | 310/363 X |

*Primary Examiner*—Mark O. Budd
*Attorney, Agent, or Firm*—Ostrolenk, Faber, Gerb & Soffen

[57] ABSTRACT

A piezoelectric vibrator comprises a mechanical vibrating member having, an aluminum layer formed on a surface of the vibrating member, and a piezoelectric transducer overlaying the aluminum layer.

1 Claim, 3 Drawing Figures

PIEZOELECTRIC VIBRATOR

BACKGROUND OF THE INVENTION

The present invention generally relates to a piezoelectric vibrator and, more particularly, to a piezoelectric vibrator of a type employing a combination of a mechanical vibrator and a piezoelectric transducer.

An example of prior art piezoelectric tuning forks is shown in FIG. 1 of the accompanying drawing, and comprises a fork vibrator 11 made of elastic invariable metal, such as elinvar, and having a pair of prongs 12 connected integrally together by a bridge portion 13 to assume a generally U-shaped configuration, and a piezoelectric transducer 16 which is formed by a piezoelectric layer 14 made of a piezoelectric material such as, for example, ZnO, in the form of a piezoelectric thin film and applied over the entire outer surface of one of the prongs 12 facing in a direction opposite to the other of the prongs 12, and an electrode layer 15 made of, for example, Au or Al, and overlaying the piezoelectric layer 14. The assembly is mounted, on a generally cylindrical stem member 17 made of an electrically insulating material and having terminal pins 18 and 19 extending axially completely through the stem member 17 and also having a support pin 20 extending axially from the stem member 17 towards the assembly, respective ends of the pins 18 ad 20 adjacent the assembly being secured to one of the opposite, generally U-shaped surface of the fork vibrator 11 while the electrode layer 15 is connected to the pin 19 through a wire 21 by the use of a wire bonding technique.

The prior art piezoelectric tuning fork shown in and described with reference to FIG. 1 has such a disadvantage in that, since the piezoelectric layer 14 is deposited direct on a surface area of the fork vibrator 11, the resonance frequency relative to temperature tends to vary considerably.

In view of the above, an attempt has been made to use a capacitor to compensate for variation of the resonance frequency relative to temperature, but this attempt has been found unsatisfactory. This disadvnatage is generally inherent in a piezoelectric tuning fork comprising a combination of a vibrating fork and a piezoelectric transducer, a piezoelectric vibrator comprising a mechanical vibrating element and a piezoelectric transducer and the like.

SUMMARY OF THE INVENTION

Accordingly, the present invention has been developed with a view to substantially eliminating the disadvantages and inconveniences inherent in the prior art piezoelectric vibrator and has for its essential object to provide an improved piezoelectric vibrator wherein the change in resonance frequency relative to temperature is minimized to improve the temperature characteristic of the vibrator.

Another important object of the present invention is to provide an improved piezoelectric vibrator of the type referred to above, wherein an inexpensive metallic material is additionally employed to render the vibrator of improved temperature characteristic to be readily meanufactured at a reasonably minimized cost.

In order to accomplish these objects of the present invention, the piezoelectric vibrator herein disclosed has an aluminum layer interposed between the mechanical vibrator and the piezoelectric transducer.

BRIEF DESCRIPTION OF THE DRAWINGS

These and other objects and features of the present invention will readily become apparent from the following description taken in conjunction with a preferred embodiment thereof with reference to the accompanying drawings, in which.

DETAILED DESCRIPTION OF THE EMBODIMENT

Figure 2:
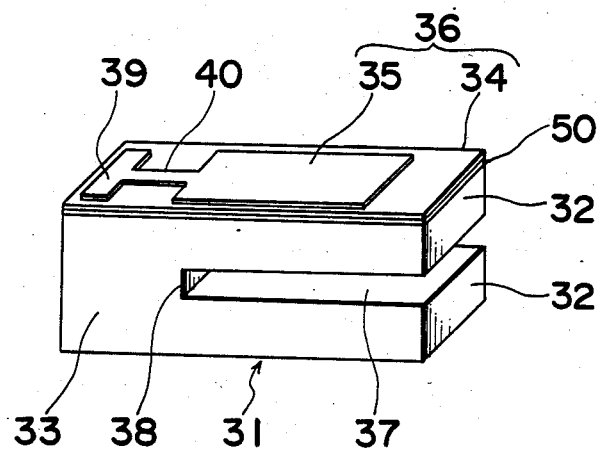
FIG. 2 is a perspective view of a piezoelectric tuning fork embodying the present invention.

Referring now to FIG. 2, a piezoelectric tuning fork embodying the present invention comprises a fork vibrator 31 of generally U-shaped configuration made of elastic invariable metal, such as elinvar, and having a pair of vibrating prongs 32 connected together by a bridge portion 33 with said prongs 32 protruding laterally outward therefrom in the same direction and in parallel to each other. In accordance with the present invention, the outer surface of at least one of the prongs 32 facing in a direction opposite to the other of the prongs 32 and including a surface area confronting the bridge portion 33 is deposited with an aluminum layer 50 of, for example, 1 $\mu$m in thickness by the use of any known sputtering technique or vapor deposition technique. Overlaying this aluminum layer 50 is a piezoelectric layer 34 deposited thereon and made of any known piezoelectric material selected from the group consisting of, for example, ZnO, AlN, ZnS, CdS, LiNbO$_3$, LiTaO$_3$, $\gamma$-Bi$_2$O$_3$ compounds and piezoelectric ceramics of lead zirconate titanate system.

The piezoelectric layer 34 has a thickness of 25 $\mu$m and has an electrode layer 35 of Au or A( deposited thereon so as to overlay one surface of the piezoelectric layer 34 opposite to the aluminum layer 50, said electrode layer 35 constituting a piezoelectric transducer 36 together with the piezoelectric layer 34.

As best shown in FIG. 2, that portion of the other surface of one of the prongs 32 which confronts with the bridge portion 33 is formed with an electrode 39 for external electric connection, which electrode 39 is connected with the electrode layer 35 through an elongated connecting electrode 40.

Figure 1:
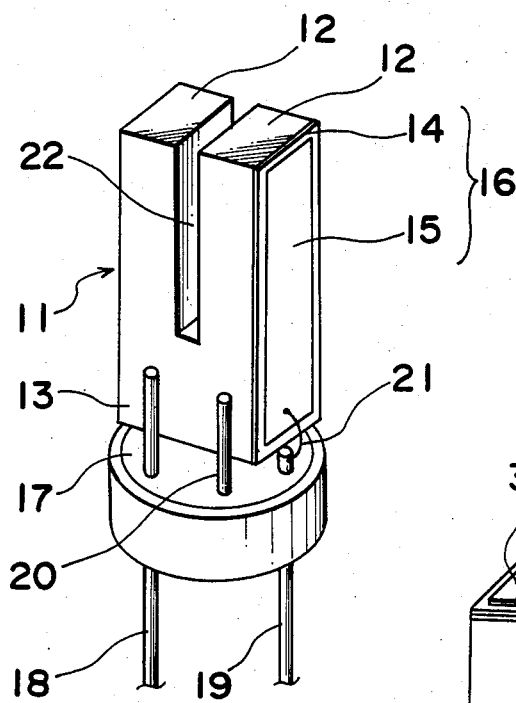
FIG. 1 is a perspective view of the prior art piezoelectric tuning fork.

The assembly of the fork vibrator 31 having the aluminum layer 50 with the transducer 36 is supported on any known stem, such as shown in FIG. 1, in any known manner such as shown in FIG. 1, thereby completing the piezoelectric tuning fork ready for use.

Figure 3:
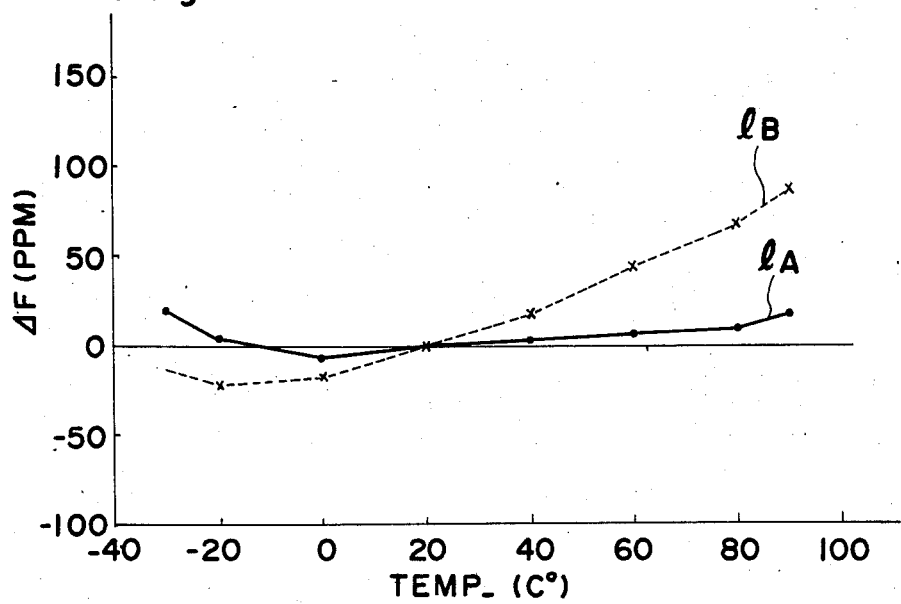
FIG. 3 is a graph showing the temperature characteristics of the piezoelectric tuning forks according to the present invention and the prior art.

A series of experiments conducted to determine the rate ($\Delta$F/Fo) of change in resonance frequency Fo relative to temperature have shown that the piezoelectric tuning fork embodying the present invention, wherein the piezoelectric layer was made of ZnO, exhibited such a temperature characteristic as shown by a solid line $l_A$ in FIG. 3, whereas the piezoelectric tuning fork wherein no aluminum layer such as shown by 50 in FIG. 2 was not employed exhibited such a temperature characteristic as shown by a broken line $l_B$ in FIG. 3.

As can readily be seen from FIG. 3, while the piezoelectric tuning fork wherein no aluminum layer is employed between the vibrator and the transducer exhibits the rate of change in resonance frequency Fo within the range of about −20 ppm to about +90 ppm relative to change in temperature within the range of −30° C. to 90° C., the piezoelectric tuning fork of the present invention exhibits the rate of change in resonance frequency Fo within the range of about −5 ppm to +20 ppm relative to the same range of change in temperature.

From the foregoing, it is clear that the piezoelectric tuning fork of the present invention exhibits the minimized rate of change in resonance frequency Fo relative to temperature which is about ¼ or less than that exhibited by the piezoelectric tuning fork having no aluminum layer. This minimized rate of change in resonance frequency has been exhibited not only by the piezoelectric tuning fork, but also by a piezoelectric vibrator and also any type of piezoelectric vibrators wherein the mechanical vibrating element is combined with the piezoelectric transducer.

It has now become clear that, since the present invention is such that the aluminum layer is provided between the mechanical vibrator and the piezoelectric transducer at a particular location, the rate of change in resonance frequency of the mechanical vibrator relative to temperature can advantageously be minimized and, therefore, the piezoelectric vibrator according to the present invention can find a relatively wide range of applications.

Although the present invention has fully been described in connection with the preferred embodiment thereof with reference to the accompanying drawings, it is to be noted that various changes and modifications are apparent to those skilled in the art. By way of example, the position and the shape of each of the electrode layer 35, the electrode 39 and the connecting electrode 40 may not be limited to such as shown in FIG. 2.

In addition, although the piezoelectric tuning fork shown in and described with reference to FIG. 2 is of a type having two terminal, the concept of the present invention equally applies to a three-terminal type. This can be accomplished by providing an additional piezoelectric transducer on the outer surface of the other of the prongs with the intervention of an additional aluminum layer between the additional transducer and the outer surface of the other of the prongs.

Accordingly, unless they depart from the scope of the present invention as defined by the appended claims, they should be construed as included therein.

We claim:
1. A piezoelectric vibrator, comprising:
a mechanical vibrating member made of elinvar;
an aluminum layer having first and second opposed surfaces, said first surface being located on one surface of said mechanical vibrating member;
a piezoelectric layer having first and second opposed surfaces, said first surface of said piezoelectric layer being located on said second surface of said aluminum layer; and
an electrode layer located on said second surface of said piezoelectric layer.

* * * * *